United States Patent
Ishida

(10) Patent No.: US 7,034,913 B2
(45) Date of Patent: Apr. 25, 2006

(54) LIQUID CRYSTAL DISPLAY DEVICE HAVING FLEXIBLE SUBSTRATES

(75) Inventor: Hiroshi Ishida, Kanagawa (JP)

(73) Assignee: NEC LCD Technologies, Ltd., Kanagawa (JP)

( * ) Notice: Subject to any disclaimer, the term of this patent is extended or adjusted under 35 U.S.C. 154(b) by 38 days.

(21) Appl. No.: 10/804,158

(22) Filed: Mar. 19, 2004

(65) Prior Publication Data

US 2004/0183959 A1 Sep. 23, 2004

(30) Foreign Application Priority Data

Mar. 20, 2003 (JP) .............................. 2003-076928

(51) Int. Cl.
*G02F 1/1345* (2006.01)
*G02F 1/1333* (2006.01)
(52) U.S. Cl. ..................... 349/150; 349/58; 349/149; 345/104
(58) Field of Classification Search .................. 349/58, 349/150; 345/104

See application file for complete search history.

(56) References Cited

U.S. PATENT DOCUMENTS 5,400,160 A * 3/1995 Takahashi et al. ............ 349/60
6,534,722 B1 * 3/2003 Takaoka ..................... 174/254
6,657,606 B1 * 12/2003 Kang et al. ................... 345/87

FOREIGN PATENT DOCUMENTS

| JP | 5-333362 | 12/1993 |
| JP | 10-148819 | 6/1998 |
| JP | 1998-80706 | 11/1998 |

* cited by examiner

*Primary Examiner*—Huyen Ngo
(74) *Attorney, Agent, or Firm*—Young & Thompson

(57) ABSTRACT

The LCD device includes a liquid crystal panel, a backlight unit, a circuit board disposed at rear side of the backlight unit, and a number of flexible substrates each mounting thereon a driver chip and connecting the terminals of the liquid crystal panel and the circuit board. The flexible substrate has a cut-out at each side edge thereof. A protrusion formed on the backlight unit or inner housing passes the cut-out to protrude toward the housing of the LCD device.

13 Claims, 12 Drawing Sheets

1 : LCD DEVICE

1 : LCD DEVICE

1A : LCD DEVICE

1A : LCD DEVICE

LIQUID CRYSTAL DISPLAY DEVICE HAVING FLEXIBLE SUBSTRATES

The present invention relates to a liquid crystal display device (hereinafter referred to as LCD device) having flexible substrates, and more particularly to a high-precision LCD device having a plurality of flexible substrates which connect together a liquid crystal panel and respective circuit boards controlling the liquid crystal panel, and are densely mounted with a small space between the flexible substrates.

LCD devices have advantages of thin and lightweight configurations and a lower dissipation power. Because of these advantages, LCD devices are used in a wide area of technical fields, including office automation apparatuses, audio-visual apparatuses, portable terminals, and the like. As shown in FIG. 17, the main components of an LCD device 1A include, for example, a backlight unit 3 having illuminating members such as elongate lamps, a reflector, an optical guide plate, and the like; an optical sheet 6 for converting the light from the backlight unit 3 into a uniform illumination light; an internal housing, or housing frame, (including, e.g., an inner plate metal shield 9 and an inner resin chassis 8, as shown in the drawing) for holding and fixing the backlight unit 3 and the optical sheet 6; a liquid crystal panel 2 in which liquid crystal is sandwiched between opposing substrates; and circuit elements such as a driver chip (driver chip IC) and a circuit board and the like for driving the liquid crystal panel 2.

There were moderate restrictions on the overall size of the conventional LCD device 1A in the past. Therefore, the driver chip and the circuit board could be arranged with little difficulty at the edges of the liquid crystal panel 2. However, in recent years, there arisen a desire to increase the size of the display area and yet decrease the size of the overall device. In order to miniaturize the housing frame of the device, the existing LCD device 1A is generally constructed with a signal board arranged on the rear side of the LCD device 1A (e.g., this could be outside the inner plate metal shield 9 in the structure shown in the drawings).

Thus, when the circuit board is arranged on the rear side of the LCD device 1A, in order to connect the liquid crystal panel 2 and the circuit board, a flexible substrate is used on which is formed a circuitry pattern made of copper foil or the like on top of a resin film made of polyimide or the like. The flexible substrate 4 is configured in the cross-sectional shape of letter "U" having two right angles, and is placed as a signal path from the edge of the liquid crystal panel 2 along the side surface of the liquid crystal panel 2 toward the circuit board disposed at the rear side of the backlight unit. Furthermore, the driver chip for driving the liquid crystal panel 2 is mounted on the flexible substrate 4 either inside or outside of the letter "U" shape.

The flexible substrate 4 is made of a resin film base material. Therefore, it is not strong mechanically when stress is externally applied thereto. Furthermore, the connections between the flexible substrate 4 and the liquid crystal panel 2 or the circuit board are not strong either. It is also necessary to protect the driver chip against the external impact and vibrations. Therefore, in the LCD device 1A having the configuration as described above, the internal housing frame (i.e., the inner plate metal shield 9 and the inner resin chassis 8 in the drawing) and the external housing frame (i.e., an external shield 7 in the drawing) are usually used to form a space on the side of the liquid crystal panel 2 to prevent stress from applying directly onto the flexible substrate 4 and the driver chip. However, the need to fabricate the LCD device 1A with a compact size and lower lightweight and to miniaturize the housing frame prevents the housing frame from being made with a higher mechanical strength. As a result, when a large external force is applied onto the side of the LCD device 1A, the external housing frame presses the flexible substrate 4, whereby the circuitry pattern on the flexible substrate 4 may be damaged, or the connections between the liquid crystal panel 2 and the circuit board are broken, or the driver chip gets damaged, or other such problems occur.

FIG. 16 shows the conventional LCD device in a perspective view, including an additional detailed view "C" encircled. In order to protect the flexible substrate 4 and the driver chip in the conventional LCD device 1A, a protrusion 13 which protrudes outward from between neighboring flexible substrates 4 is provided on one of the components of the LCD device 1A, or on the outer side surface of the internal housing. When a pressure is applied onto the external housing, this protrusion 13 abuts the external housing to prevent the stress from applying directly onto the flexible substrate 4.

An example of the structure with the protrusion 13 provided between the flexible substrates 4 is described in Japanese Patent Laid-Open Publication No. 10-148819. This publication describes an LCD device having flexible substrates each of which is bent so that integrated circuits for driving a liquid crystal panel can be arranged on a first main surface on a liquid crystal display side, and an opposing second main surface (refer to FIG. 1 and pp5–6). A cushioning member formed as a protrusion is provided near the integrated circuit on the side of the liquid crystal panel, protruding from the flexible substrate toward the external housing.

In recent years, LCD devices have been required to achieve higher precision, and yet at reduced costs. Higher precision involves increase of the number of pixels built in the liquid crystal panel to increase the number of data lines in the liquid crystal panel. However, there is a limit to the number of data lines which can be controlled by using a single flexible substrate. Therefore, when the number of data line increases, a larger number of flexible substrates are also required. Thus, the density of the flexible substrates necessarily increases and the spacing between the adjacent flexible substrates becomes smaller. As a result, it becomes difficult to provide a space through which the protrusion passes between the adjacent flexible substrates as in the case of LCD device described in the above publication.

One method to solve the above problem is to form the circuitry pattern on the flexible substrate at a tighter pitch and to make the width of each flexible substrate narrower, in order to provide a space through which the protrusion passes between the flexible substrates. The flexible substrate, however, is different from a normal printed circuit board. The flexible substrate is manufactured using special materials and a special manufacturing method, and, therefore, is expensive. If each LCD device were to be made with a flexible substrate designed specifically for that LCD device, then the cost of the LCD device would increase, and it would not be possible to achieve one of the objectives of LCD devices, which is to reduce the costs thereof. Furthermore, since the flexible substrate is connected to the liquid crystal panel and to the signal board, and the driver chip is mounted onto the flexible substrate, it is necessary to take these connections into account for designing the circuitry pattern on the flexible substrate.

It is a principal object of the present invention is to provide an LCD device capable of protecting a flexible substrate and a driver chip with a higher reliability, even when these elements are provided in a high-precision LCD device in which flexible substrates are densely mounted on the liquid crystal panel.

The present invention provides a liquid crystal display (LCD) device including: a plurality of components including a liquid crystal panel having an array of terminals and a backlight unit disposed at rear side of the liquid crystal panel for irradiating the liquid crystal panel; an external housing for covering at least side surfaces of the components; a circuit board disposed at rear side of the backlight unit; at least one flexible substrate having a line pattern thereon for electrically connecting together the terminals and the circuit board, the flexible substrate having therein a cut-out on at least one of side edges of the flexible substrate; and a protrusion protruding from one of the components toward the external housing while passing the cut-out.

In accordance with the LCD device of the present invention, the protrusion protruding one of from the components toward the external housing while passing through the cut-out protects the flexible board against the contact or pressure by the external housing, thereby achieving a higher reliability for the LCD device.

The above and other objects, features and advantages of the present invention will be more apparent from the following description, referring to the accompanying drawings.

PREFERRED EMBODIMENTS OF THE INVENTION

Figure 1:
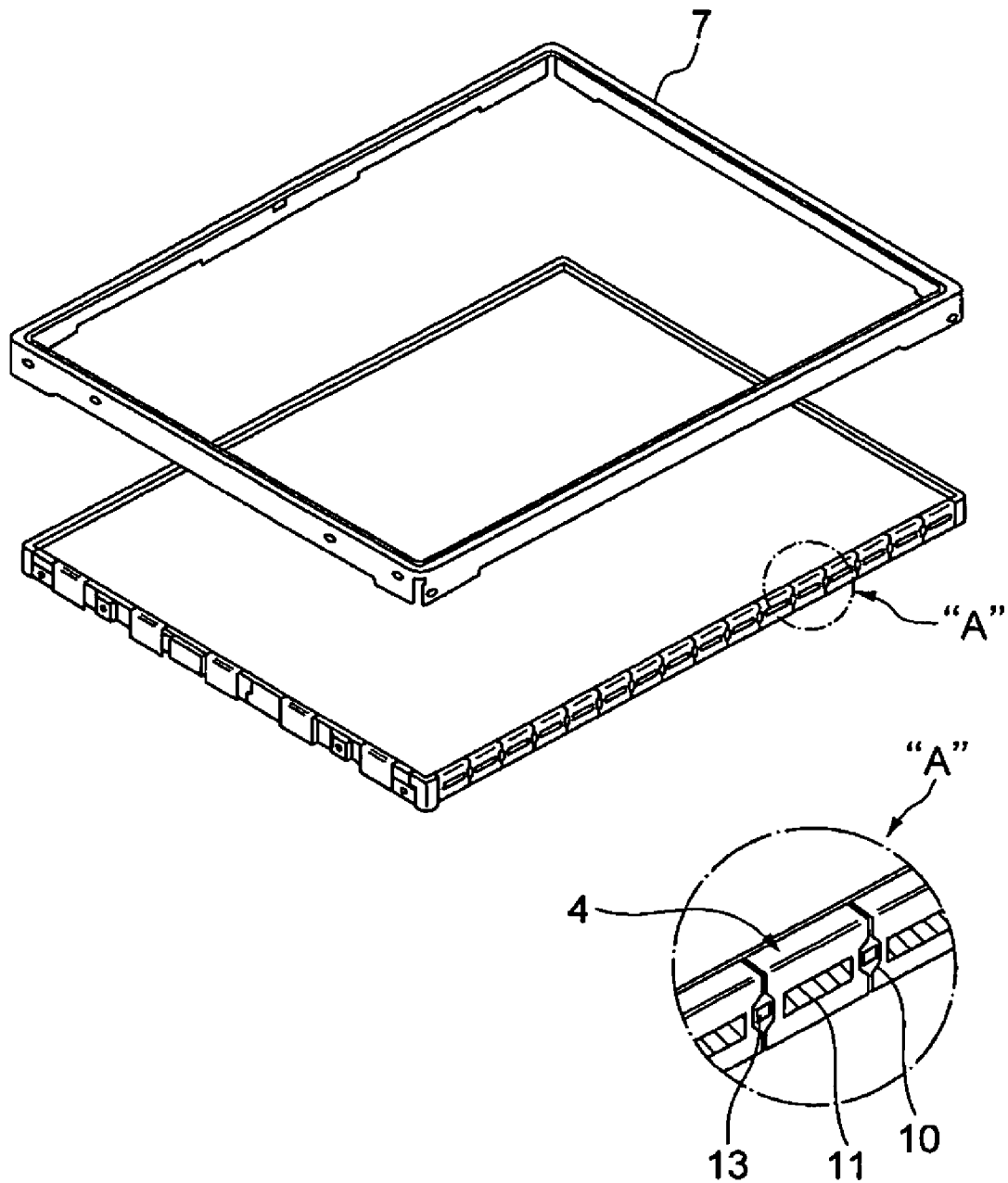
FIG. 1 is an exploded perspective view of an LCD device according to a first embodiment of the present invention, as viewed from its display screen side, including an additional detailed view of "A".

Before describing the preferred embodiments of the present invention, the principle of the present invention will be first described for a better understanding of the present invention.

The present invention relates to an LCD device having a structure in which a circuit board for controlling the liquid crystal panel is arranged on the rear side of the LCD device. The flexible substrate used for connecting the liquid crystal panel and the circuit board is provided with a cut-out in a predetermined shape at an edge of the flexible substrate as viewed in the direction in which the flexible substrates are arranged in a row. Thus, even in the high-precision LCD device in which the flexible substrates are mounted densely, the protrusion, which is provided on one of the members constituting the LCD device or the internal housing, can be passed through the cut-out, or the space between the adjacent flexible substrates. Therefore, even when external impact or vibrations is applied onto the LCD device, the contact between the external housing and the flexible substrate or between the external housing and the driver chips mounted on the substrate can be prevented to protect the flexible substrate and the driver chip, thereby improving the reliability of the LCD device.

As described in the discussion of the prior art, in order to reduce the size of the housing frame, LCD devices are constructed in recent years by mounting a signal board, a conversion board, or other circuit boards for controlling a liquid crystal panel onto the housing on a rear side of the LCD device. Then, the circuit boards are connected to the liquid crystal panel by means of a plurality of flexible substrates, each of which is manufactured by forming a circuitry pattern onto a flexible base material. In order to protect the flexible substrate or a driver chip mounted on the flexible substrate, a protrusion which protrudes outward from between the flexible substrates is provided on one of the components of the LCD device, such as the internal housing (frame). This prevents deformation of the external housing from occurring when an external force is applied to the external housing (frame).

The conventional LCD device does not have a large number of rows of pixels. Therefore, there used to be a sufficient space between adjacent flexible substrates to provide the above-described protrusion protruding therethrough in the conventional LCD device. However, along with the developments in a higher precision and a larger number of rows of pixels achieved in the LCD device, the LCD device has a greater number of flexible substrates. Since the flexible substrates are formed with greater density and the space for the protrusions is narrowed, the protrusions are difficult to be used to effectively protect the flexible substrates and the driver chips.

More specifically, a conventional SXGA-type LCD device has 1280×3 pixels (3-color RGB) arranged along the direction of the image lines for a total of 3,840 of data lines. In a general purpose flexible substrate, 384 circuitry patterns are formed onto each substrate, whereby 10 flexible substrates are needed along the direction of the image lines. Here, it is assumed that the screen size of the LCD device is 20.1 inches and the width of a single general purpose flexible substrate is approximately 26 mm. In this case, a space of approximately 14 mm can be guaranteed between the flexible substrates. On the other hand, a QXGA-type high-precision LCD device has 2,048×3=6,144 of data lines along the direction of the image lines. In this case, 16 flexible substrates are necessary along the direction of the image lines if the same general purpose flexible substrate is to be used. Considering that the screen of the LCD device is approximately 21.3 inches, the distance between the adjacent flexible substrates is approximately 1 mm. Therefore, along with a higher precision of the LCD devices, it becomes more difficult to insert the protrusions between the adjacent flexible substrates.

In order to overcome the problem as described above, a method is conceivable for creating a sufficient space to insert the protrusion by forming the specific circuitry patterns on the flexible substrates more densely and by reducing the width of the flexible substrates themselves. This method involves using a photolithographic technique to etch copper plate onto a polyimide film tape of a given width (for example, 35 mm, 48 mm, 72 mm are standard widths heretofore employed), and then punching or otherwise subdividing the tape to create the flexible substrates. It is to be noted that the costs of manufacturing such flexible substrates can be reduced by forming the flexible substrates in a standard type for a variety of LCD devices. However, the costs of manufacturing the flexible substrates designed for each of the LCD devices to have the special circuitry patterns on the flexible substrates, as described above, which is a fatal drawback if the LCD devices have individual flexible substrates.

Furthermore, the flexible substrates and the liquid crystal panel are connected together by using terminals which are provided thereto respectively. An anisotropic conductive film (ACF) is typically used to achieve these connections at a lower cost and with a smaller surface area. ACF is prepared by mixing conductive particles into a thermal-curing adhesive. The ACF may then be applied by coating onto the terminals of the liquid crystal panel, for example. Alternatively, ACF that is formed as a film tape may be applied onto the terminals of the liquid crystal panel. Then, the adhesive on the terminals of the flexible substrates, which are disposed to oppose each another, is cured by heat or pressure so as to electrically connect the terminals to each other via the ACF. In the above process, if the space between the flexible substrates or between the terminals of the liquid crystal panel is made too small, then the ACF involves a risk of a short-circuit failure occurring between adjacent terminals. This risk imposes a restriction on the spacing between the terminals. As a result, the width of the flexible substrates is difficult be reduced further.

Furthermore, since the flexible substrates have a flexibility, it is difficult to fix the positions accurately when the liquid crystal panel is connected thereto. If an angle(θ)-displacement occurs, then a short-circuit failure occurs between adjacent terminals or electrical conductivity cannot be guaranteed. Therefore, a certain degree of margin is needed between the terminals, i.e., they cannot be configured without consideration of these failures. Moreover, in order to reduce the costs of the LCD device, a general purpose IC chip is used as the driver chip, which is mounted onto the flexible substrate. Therefore, the circuitry pattern of the flexible substrate must also be formed so as to accommodate the shape of the driver chip's terminal. This also prevents the circuitry pattern from being designed freely.

Because of the reasons as described heretofore, in the high-precision LCD device, it is difficult to arrange the protrusion so as to protrude out from between the flexible substrates. Therefore, when an external impact or when vibrations or the like occur in the LCD device, the external housing makes contact with the flexible substrate and the driver chip mounted thereon, thereby damaging the flexible substrate or the driver chip to degrade the reliability of the LCD device. It is to be noted that the circuitry patterns on the flexible substrates cannot be formed at uniform intervals. Rather, the circuitry has to curve around the location where the driver chip is mounted. As a result, this involves areas around the periphery of the driver chip where the circuitry patterns cannot be formed.

In order to overcome those problems, the preferred embodiment of the present invention uses a standard general purpose flexible substrate, and the portion in the flexible substrate where the circuitry pattern is not formed (which is generally the area beside the driver chip) is cut out in a predetermined shape, so as to create a space through which a protrusion passes, the protruding being formed on one of the components of the LCD device such as the internal housing. This structure enables the protrusion to provide reliable protection of the flexible substrate and the driver chip, and thus improves the reliability of the LCD device, even in the high-precision LCD device with a small space between the adjacent flexible substrates.

It is to be noted that, the publication illustrating the conventional technique describes the structure in which the protrusion is arranged between the flexible substrates. However, this publication assumes an LCD device having a small and enough number of pixels so that sufficient space can be established between the flexible substrates. This technique is difficult to be applied in the high-precision LCD devices of recent years. Therefore, by adopting the structure which gives consideration to the circuitry pattern on the flexible substrates and making full and effective use of the areas where the circuitry pattern is not formed to form a space through which the protrusion passes, the present invention is the first to enable both the increased precision and the reduced cost of the LCD device.

[Embodiments]

Now, embodiments of the present invention will be described in detail with reference to the accompanying drawings.

[First Embodiment]

Figure 2:
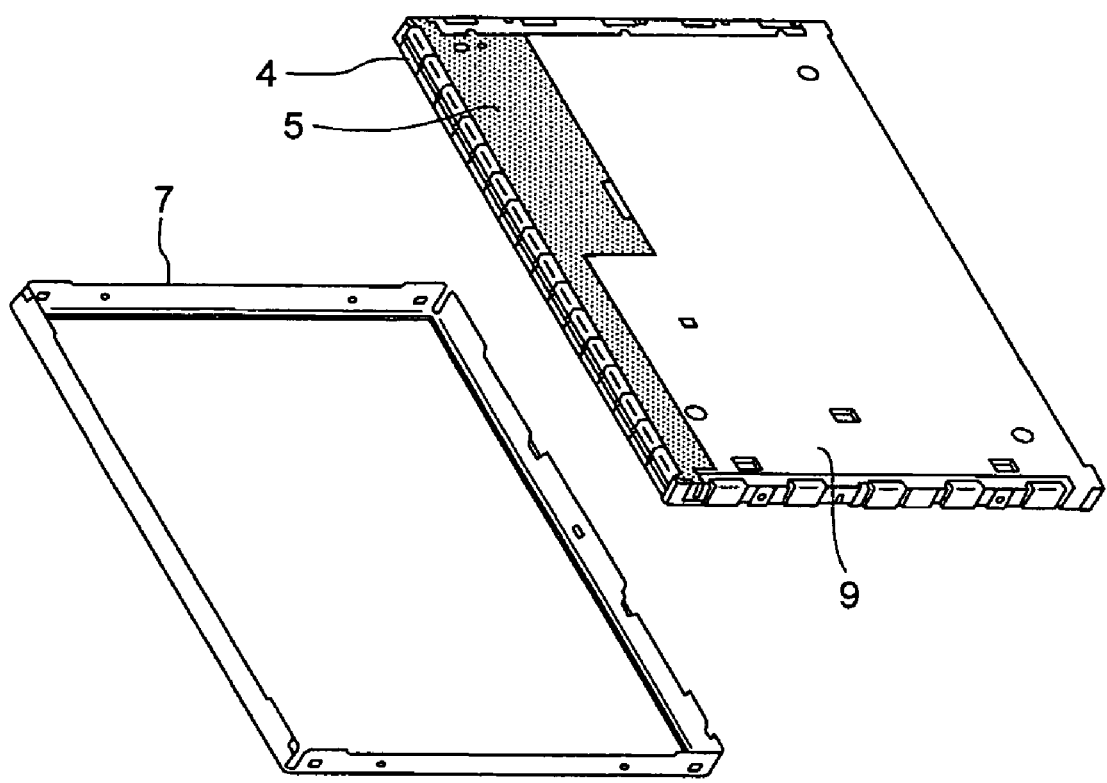
FIG. 2 is an exploded perspective view of the LCD device according to the first embodiment, as viewed from its rear side.
Figure 3:
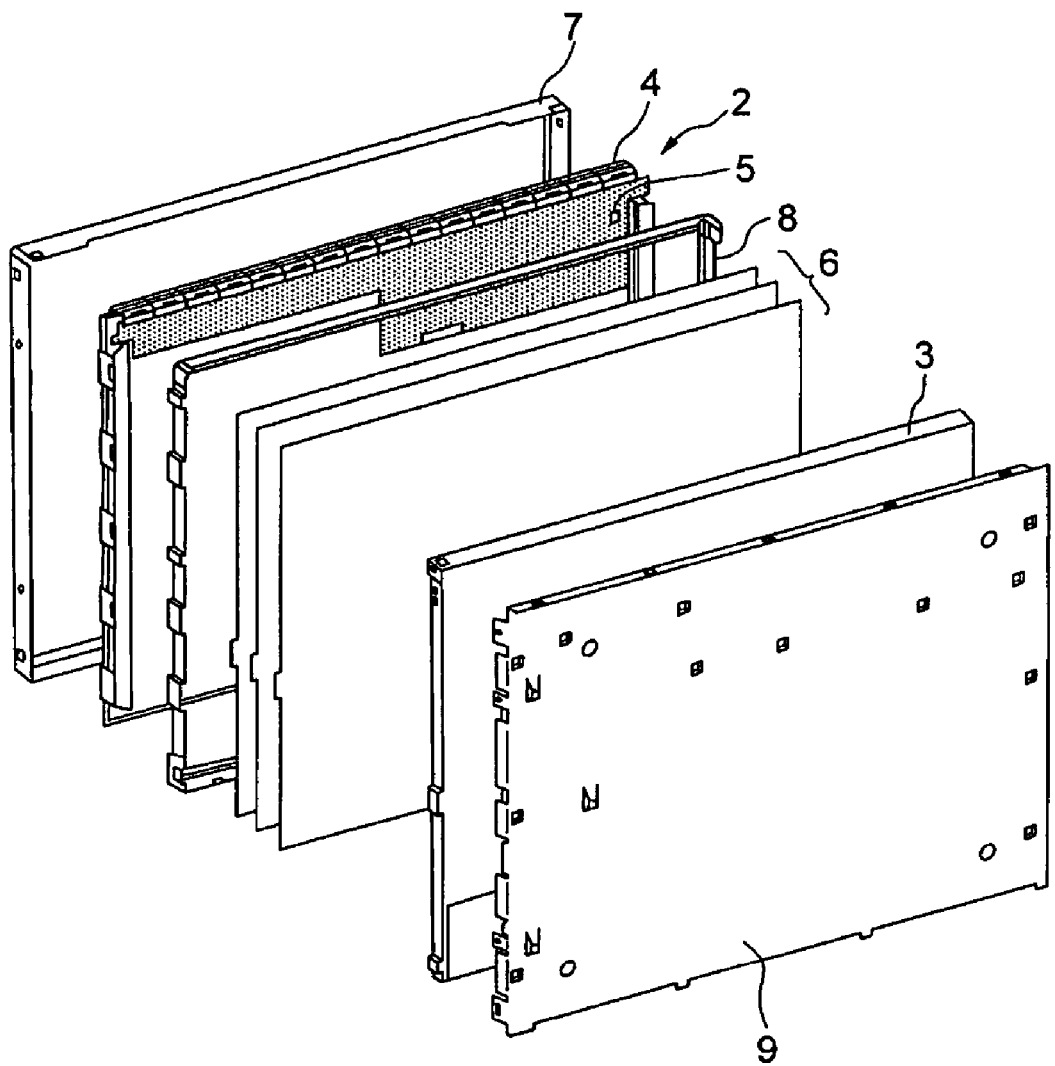
FIG. 3 is an exploded perspective view of the LCD device according to the first embodiment.
Figure 7:
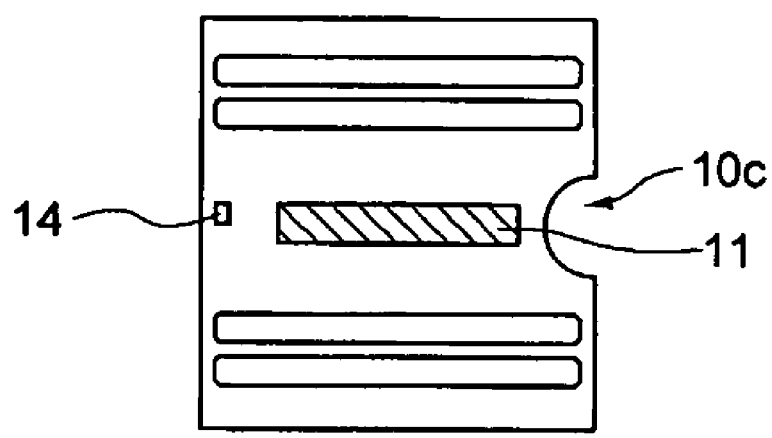
FIG. 7 is yet another top plan view showing the structure of the flexible substrate used in the LCD device according to the first embodiment.
Figure 8:
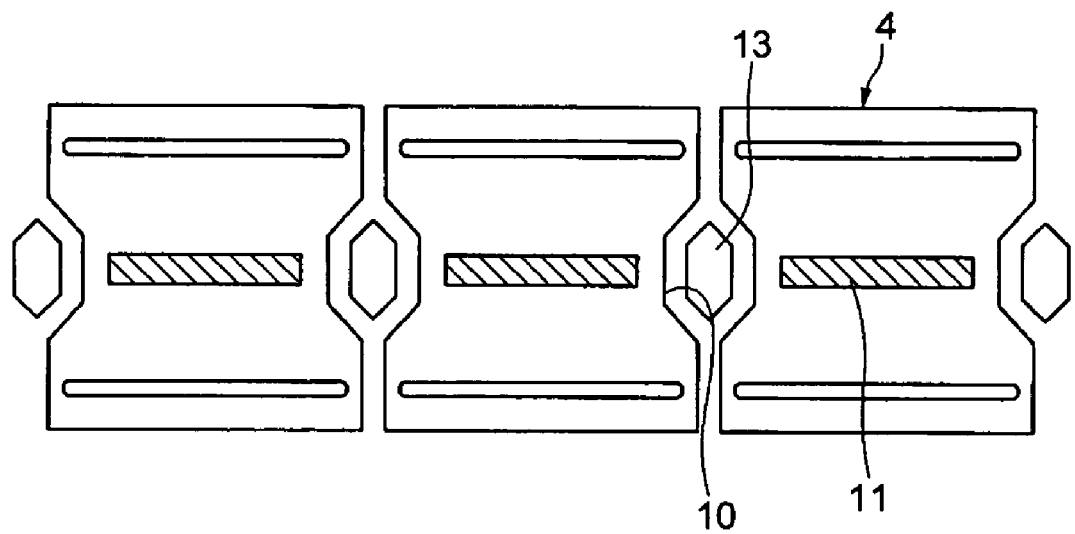
FIG. 8 is a top plan view showing positional relationships between the flexible substrates and the protrusions in the LCD device according to the first embodiment.
Figure 9:
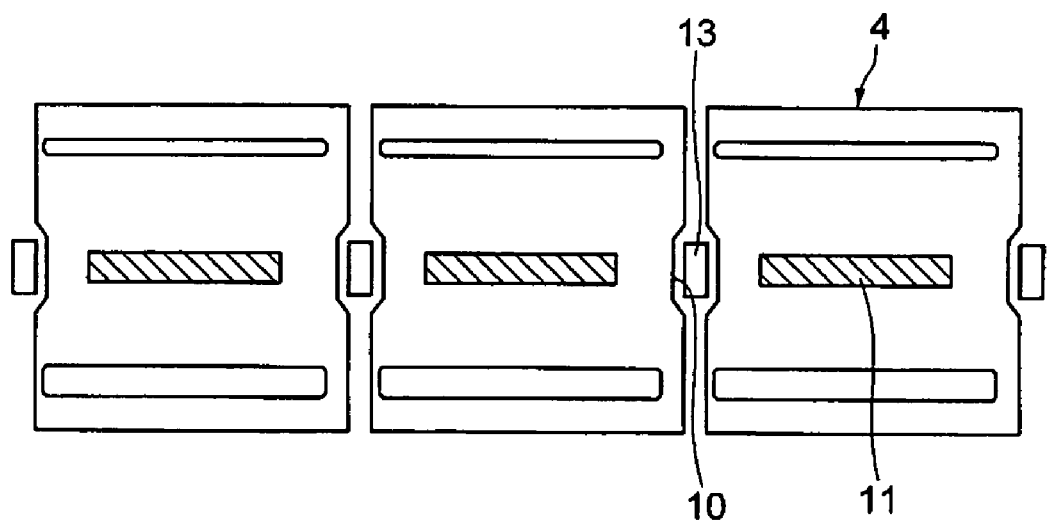
FIG. 9 is another top plan view showing positional relationships between the flexible substrates and protrusions in the LCD device according to the first embodiment.
Figure 10:
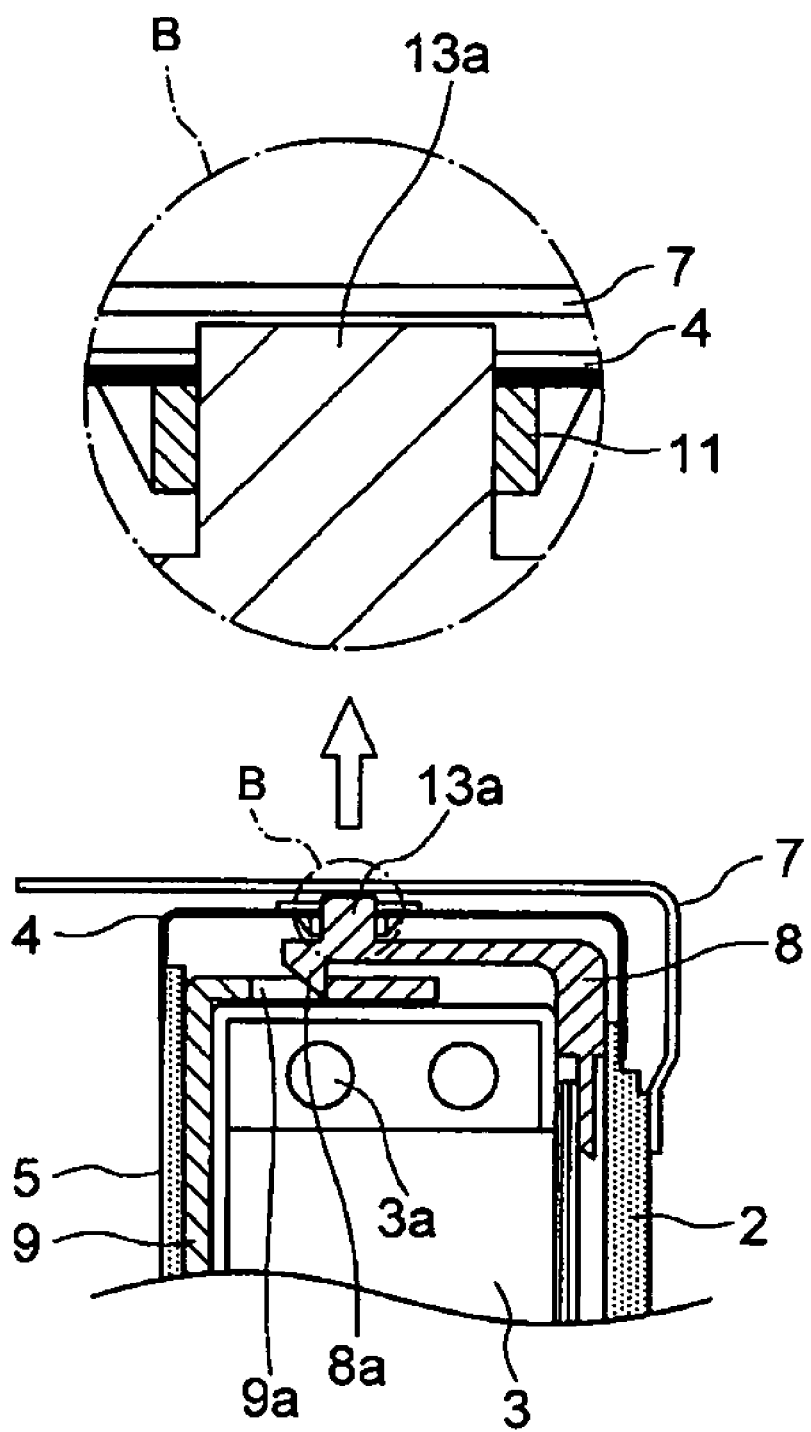
FIG. 10 is a sectional view showing the structure around the protrusion in the LCD device according to the first embodiment, including an additional detailed view "B".

An LCD device according to the first embodiment of the present invention will be described with reference to FIG. 1 through FIG. 13. FIG. 1 and FIG. 2 are exploded perspective views showing the structure of the LCD device according to the first embodiment. FIG. 3 shows a layer structure of the components of the LCD device. FIG. 4 through FIG. 7 are top plan views each showing the structure of the flexible substrate used in the present embodiment. FIG. 8 and FIG. 9 are top plan views each showing a relationship between the flexible substrates and the protrusions. FIG. 10 through FIG.

13 are sectional views each showing the structure of each component around the protrusion of the LCD device.

First, with reference to FIG. 1 through FIG. 3, the overall structure of the LCD device of the present embodiment will be described. The LCD device 1 of the present embodiment includes as the main components thereof: a liquid crystal panel 2; a backlight unit 3 having therein a lamp as a light source, a reflective sheet, an optical guide plate or the like; an optical sheet 6 for converting the light from the backlight into a uniform illuminating light; a signal board, a connection substrate or the like acting as a circuit board 5 for controlling the liquid crystal panel 2; and a housing for holding and fixing these components.

In the drawings, the exemplified housing includes: a rear-side bottom plate (referred to as an inner plate metal shield 9) for holding and fixing together the backlight unit 3 and the optical sheet 6; a resin frame (referred to as an inner resign chassis 8), provided between the backlight unit 3 and the liquid crystal panel 2, for fixing the position of the liquid crystal panel 2; and a metal frame (referred to as an external shield 7) provided on the display side for holding and fixing the liquid crystal panel 2 on the backlight unit 3. However, the housing may be of any structure so long as it is able to hold and fix together the components of the LCD device 1. It may be constructed using only the rear-side bottom plate and the front-side metal frame, for example. It may also have another unit other than the inner resin chassis 8 for holding and fixing together the components.

Furthermore, the liquid crystal panel 2 is constructed by inserting liquid crystal into a gap between a first insulation substrate formed with a film transistor or other switching element and a second insulation substrate opposing the first insulation substrate. Terminals disposed corresponding to the arrangement of pixels are arranged at a given pitch (e.g., approximately 55 µm) near the periphery of the liquid crystal panel 2. A plurality of flexible substrates 4 are connected electrically at one edge of each by using an ACF (Anisotropic Conductive Film). The driver chip IC (referred to as a driver chip 11 hereinafter) for driving the liquid crystal panel 2 is mounted onto the flexible substrate 4, either onto the top or bottom surface of the flexible substrate 4. The other edges of the flexible substrates 4 are connected to the circuit board 5.

In order to reduce the width of the housing frame, the circuit board 5 is arranged on the rear side of the LCD device 1 (i.e., the rear side of the inner plate metal shield 9 in the exemplified structure shown in the drawings), and the flexible substrates 4 extend outward from the terminals around the liquid crystal panel 2 and curve around at the outer periphery of the liquid crystal panel 2 so as to cover the side surfaces of the backlight unit 3 and the liquid crystal panel 2, and then curve around again at the position of the inner plate metal shield 9 and connect to the circuit board 5. Thus, as viewed from the side of the liquid crystal panel 2, the flexible substrate 4 is shaped as a letter "U" having two right angles, or "]".

A protrusion 13 protruding toward the external housing is formed on either the backlight unit 3 or the internal housing (the inner resin chassis 8 or the inner plate metal shield 9). The external housing (external shield 7) which covers the liquid crystal panel 2 is arranged to the outer side of the flexible substrate 4, and is arranged in the vicinity of the top of the protrusion 13. Therefore, the flexible substrates 4 are constructed so as to be received within the space held by the protrusion 13 on the side of the LCD device 1.

In the conventional LCD device having a smaller number of pixels as in the case of SXGA type LCD device described before, only a few flexible substrates 4 have to be arranged on each side of the liquid crystal panel, and particularly along the extending direction of the image signal lines (i.e., the longer side direction in the drawing). Thus, a sufficient space could be established between each two of the flexible substrates 4. However, when using the QXGA type LCD device or a more precise LCD device, the number of pixels increases significantly without a significant change in the size of the screen. Therefore, spaces between the flexible substrates 4 are smaller, and thus it is difficult to arrange the protrusion 13 in the QXGA type LCD device.

In order to overcome the problem as described heretofore in the present embodiment, spaces are provided by forming a cut-out 10 having a specified shape to each flexible substrate 4 positioned on the side area of the LCD device 1, at both ends of the flexible substrates 4, as viewed along the direction in which the flexible substrates 4 are arranged (i.e., the direction in which the corresponding side of the liquid crystal panel 2 extends). Thus, even in the high-precision LCD device in which the flexible substrates 4 are arranged densely, or at a smaller pitch, the protrusion 13 can be passed through the area formed by the cut-outs 10. Therefore, even if the shape of the external shield 7 is changed by external impact or vibrations, the contact between the external shield 7 and the flexible substrates 4 can be prevented.

Figure 4:
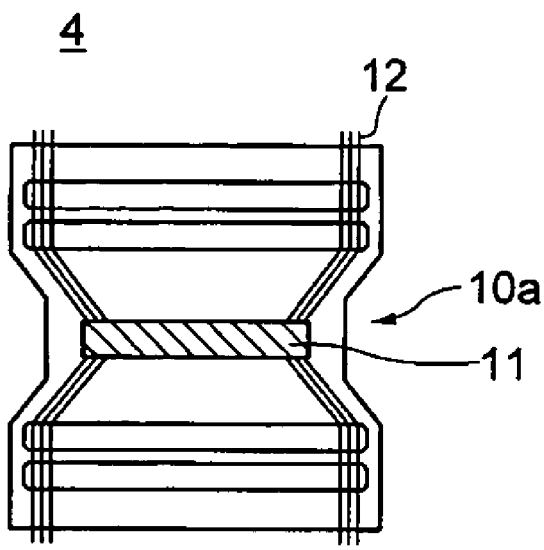
FIG. 4 is a top plan view showing the structure of a flexible substrate used in the LCD device according to the first embodiment.

With reference to FIG. 4 through FIG. 7, concrete examples of the cut-out 10 will be detailed. As shown in FIG. 4, the driver chip 11 is mounted onto the flexible substrate 4 at a position opposing the side area of the LCD device 1, and the circuitry pattern 12 is formed on the flexible substrate 4 between the edge of the liquid crystal panel 2 and the driver chip 11, and between the driver chip 11 and the edge of the circuit board 5. The circuitry pattern 12 is formed so as to curve around the driver chip 11, and the flexible substrate 4 is provided with a trapezoidal cut-out 10a, which has a side edge that is substantially parallel to the curved portion of the circuitry pattern 12. The trapezoid cut-out 10a is generally formed simultaneously with the process wherein the rolled flexible substrates 4 are punched out using a die and divided into individual pieces. However, it may also be formed after the flexible substrates 4 are divided into their individual pieces.

The angle at which the cut-out 10a is formed and the width of the cut-out 10a are not restricted to the configurations shown in the drawings. Rather, they may be formed in any shape so as to accommodate the shape of the circuitry pattern on the flexible substrates 4, the mounting position of the driver chip 11, and the like. Preferably, at least, the cut-out portion should be substantially parallel to the circuitry pattern 12 so as to increase the space formed by the cut-outs 10a. Also, the space between the cut-out 10a and the circuitry pattern 12 should be maintained at a substantially uniform distance so that the stress occurs evenly on the circuitry pattern 12.

The cut-out 10a is trapezoidal in FIG. 4. However, as described above, the flexible substrates 4 are fixed on two sides thereof to the terminals of the liquid crystal panel 2 and the terminals of the circuit board 5. Stress is likely to occur between these two sides because the intermediate position therebetween is not supported. In particular, the longer side of the LCD device 1 is likely to change in the shape thereof due to thermal expansion of the components. Stress is also likely to occur on the flexible substrates 4 along the direction in which the flexible substrates 4 are arranged. Furthermore, since the flexible substrates 4 are made of polyimide or some other resin film base material, they are mechanically week. Therefore, there may be cases where the stress causes a crack which may sever the circuitry pattern 12 or cause other problems. In order to minimize these problems, the corners of the cut-out 10 may be preferably rounded, as shown in FIG. 5, so that the stress does not locally concentrate at a single point.

The protrusion 13 provided on the backlight unit 3, the inner plate metal shield 9, or the inner resin chassis 8 serves to make contact with the external shield 7 to minimize deformation of the external shield. For example, in a case where the protrusion 13 is formed in a non-metallic member such as the inner resin chassis 8, the protrusion 13 may be formed in a cylindrical shape so as to increase its strength.

Figure 6:
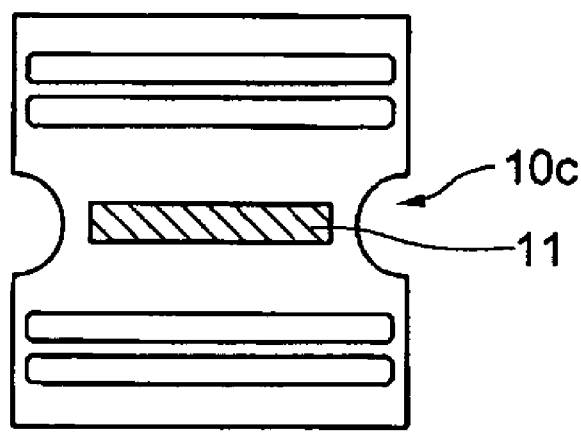
FIG. 6 is yet another top plan view showing the structure of the flexible substrate used in the LCD device according to the first embodiment.

In such a case, the shape of a cut-out 10c is preferably selected to conform to the shape of the protrusion 13, and as shown in FIG. 6, a structure may be used in which a semi-circular cut-out 10c is provided in the flexible substrates 4.

Figure 5:
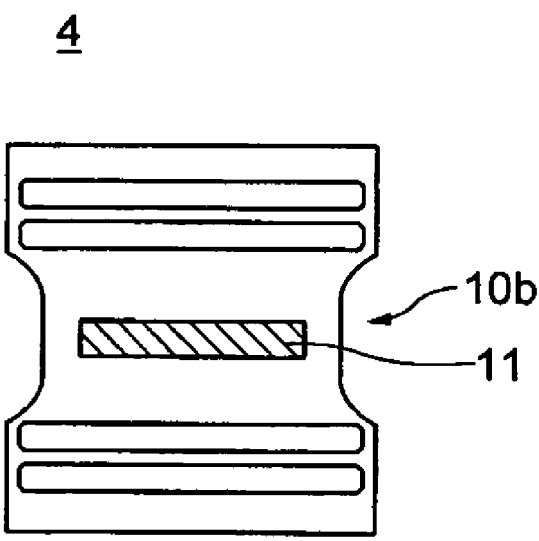
FIG. 5 is another top plan view showing the structure of the flexible substrate used in the LCD device according to the first embodiment.

In FIG. 4 through FIG. 6, the cut-outs 10 are provided symmetrically on the left and right on both sides along the direction in which the flexible substrates 4 are arranged. However, it is also possible to provide the cut-outs 10 in different shapes on the left and right. As shown in FIG. 7, when a different pattern 14 is formed on one side, or when the driver chip 11 is mounted asymmetrically or the like, the cut-outs 10 can be formed on either the left side or the right side, and its shape can be determined freely based on consideration of the shape of the circuitry pattern 12, the shape of the protrusion 13, the position at which the driver chip 11 is mounted, etc.

As describe above, the flexible substrates 4 used in the LCD device of the present example are arranged, with the cut-outs 10 having a predetermined shape provided in the portion near the driver chip 11 where the circuitry pattern 12 is not formed. Therefore, even in the high-precision LCD device in which the flexible substrates 4 cannot be spaced widely apart, the protrusion 13 can be arranged so as to pass through a space between the cut-outs 10 formed in the neighboring flexible substrates 4, and thus the flexible substrates 4 and the driver chip 11 can be protected. More specifically, as shown in FIG. 8, when the standard flexible substrates 4 are used in the above-described QXGA-type LCD device 1, only about 1 mm of space can be obtained between the flexible substrates 4. By providing the cut-outs 10 of approximately 2–3 mm, the space can be increased to approximately 5–7 mm, and thus it becomes possible to form a sufficiently large protrusion 13.

It may be considered that, even with a narrow space of approximately 1 mm for the space between the adjacent flexible substrates 4, it is still possible to form the protrusion 13 having a smaller size. However, in fact, slight misalignments occur at each stage of assembly, and this makes the assembly procedure extremely difficult when the space between the flexible substrates 4 and the protrusion 13 are substantially the same size. According to the present invention, by creating a cut-out of just 1 mm, a space of approximately 1 mm can be created between the protrusion 13 and the flexible substrate 4, and the LCD device 1 can be formed without damaging the flexible substrate 4 even when slight misalignments are incurred during the assembly.

Next, description is provided regarding the structure of the protrusion 13 formed so as to conform to the space of the cut-outs 10 in the flexible substrates 4 constructed as described above. The protrusion 13 only has to protrude outward from the side area of the LCD device 13, and thus may be formed to any of the components of the LCD device 1 other than the external housing (the external shield 7).

For example, as shown in FIG. 10, a protrusion 13a may be formed on the inner resin chassis 8. Since the inner resin chassis 8 is formed using a mold, this structure allows the protrusion 13a to be formed in the desired shape, and the height of the protrusion 13a to be controlled with ease. Further, by forming the protrusion 13a using resin, the flexible substrates 4 is free from damage even after the protrusion 13a and the flexible substrates 4 contact each other. Furthermore, the elasticity of the inner resin chassis 8 itself can also serve as a cushioning member for absorbing a shock occurring when the external shield 7 is deformed.

Figure 11:
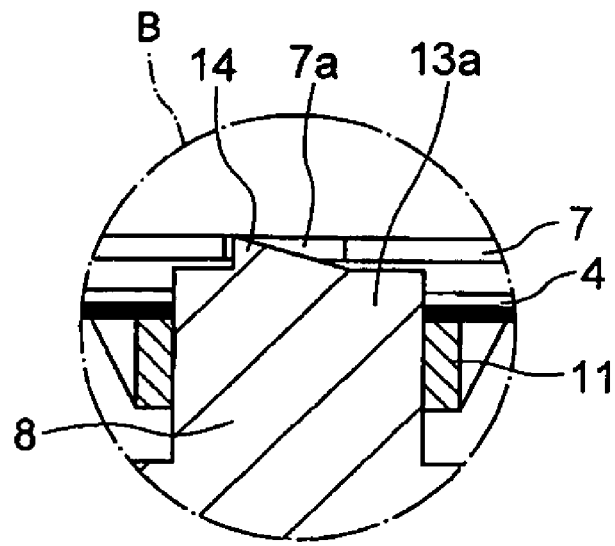
FIG. 11 is another sectional view showing the structure around the protrusion in the LCD device according to the first embodiment.

In such a case, as shown in FIG. 11, a hook 14 may be provided on the tip of the protrusion 13a formed on the inner resin chassis 8, and a hook hold 7a for engaging with the hook 14 may be formed on the external shield 7. By using this type of hook 14 and hook hold 7a, the inner resin chassis 8 and the external shield 7 can be held together at multiple points so as to increase the strength of the LCD device 1.

Figure 12:
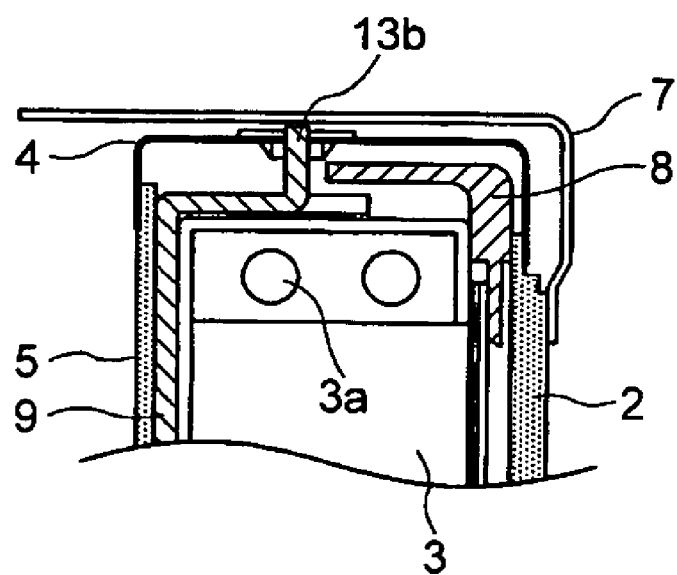
FIG. 12 is yet another sectional view showing the structure around the protrusion in the LCD device according to the first embodiment.

Furthermore, as shown in FIG. 12, a portion of the inner plate metal shield 9 can be bent to serve as a protrusion 13b. Since the inner plate metal shield 9 is made of metal, this structure allows the protrusion 13b to have a higher strength. For example, in a case where there is only a small remaining area in which the circuitry pattern 12 on the flexible substrate 4 is not formed, or when it is impossible to form a large cut-out 10, even a small protrusion 13b can suppress the deformation of the external shield 7 with a higher reliability, thereby effectively protecting the flexible substrates 4 and the driver chip 11.

Figure 13:
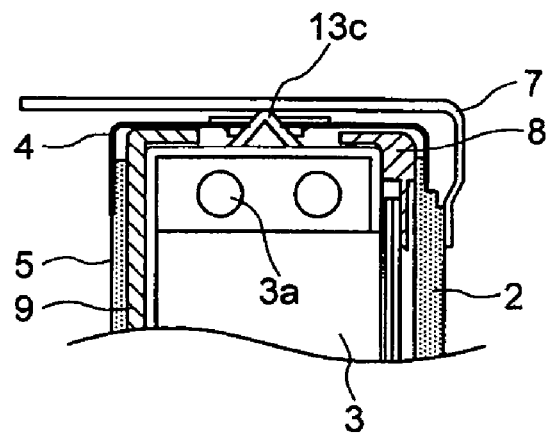
FIG. 13 is yet another sectional view showing the structure around the protrusion in the LCD device according to the first embodiment.

Referring to FIG. 13, the frame constituting the side wall of the backlight unit 3 may be raised so as to serve as a protrusion 13c, or a protrusion 13c made of metal or resin or the like may be formed on the side wall of the backlight unit 3. In this type of structure, since the backlight unit 3 is the largest unit in the LCD device, the protrusion 13c formed on the backlight unit 3 can prevent the deformation of the external shield 7 with a higher reliability. In any of the above-described structures, the protrusion 13 only has to protrude out from the flexible substrate 4 by a small amount. This enables reduction of the distance between the flexible substrate 4 and the external shield 7, and achieves smaller dimensions of the housing. Furthermore, the protrusion 13 may be of any shape provided that it can pass through the space formed by the cut-outs 10. However, the protrusion 13 is preferably formed in the shape corresponding to the shape of the above-described cut-outs (e.g., a similar shape) because such a shape would enable the space to be utilized effectively.

Back to FIG. 3, a method of assembling the LCD device of the present embodiment including the flexible substrates 4 and the protrusions 13 having the structures described above will be described.

First, the backlight unit 3 which is provided with the reflective sheet, the backlight lamp which serves as the light source, the optical guide plate, and other components is fitted to the inner plate metal shield 9, and these are fixed together using a screw or the like. Next, the optical sheet 6 which is constituted by a dispersion film, a lens film, a polarizing film, and the like in this order is layered on top of the backlight unit 3. Then, the inner resin chassis 8 is placed on top of the resultant structure, and the hook (e.g., the hook 8a in FIG. 10) formed on the inner resin chassis 8 is placed into the hook hold (e.g., the hook hold 9a in FIG. 10) formed on the inner plate metal shield 9, and then the backlight unit 3 and the optical sheet 6 are positioned and fixed.

ACF is then applied onto the terminals of the liquid crystal panel 2, in which liquid crystal is sandwiched by two opposing substrates. The ACF may be, for example, a film tape including a exfoliative PET (polyethylene terephthalate) base material coated with epoxy resin material and an top separator. The epoxy resin material is mixed with metal granules or electro-conducive granules made of plastic resin coated with an electro-conducive substance and coated so as to provide a 10 μm–100 μm thick film on the base material.

Then, a pressure-welding head is used to apply a given amount of pressure and heat to apply the ACF by a temporary pressure-welding attachment. Thereafter, the top separator of the ACF is peeled off, and the flexible substrate 4 are then mounted thereon with the terminals thereof opposing the resultant ACF. Thereafter, the pressure-welding head is used again to apply heat and pressure from the top of the flexible substrate 4 to cause the permanent attachment, whereby the flexible substrates 4 and the liquid crystal panel 2 terminals are connected to each other. Then, the other terminals of the flexible substrate 4 and the circuit board 5 are connected together using a similar process or some other known process such as soldering or face-down bonding or the like.

Next, the liquid crystal panel 2 having the flexible substrate 4 connected thereto is positioned and mounted onto the specified position of inner resin chassis 8. Then, the flexible substrate 4 mounting thereon the driver chip 11 is bent so that the driver chip 11 is situated inward, and the flexible substrate 4 and the circuit board 5 are wrapped around the side surface of the backlight unit 3 as a whole, to thereby place the circuit board 5 on the rear surface of the inner plate metal shield 9. In this step, the protrusion 13 is formed on the inner resin chassis 8, the inner plate metal shield 9 or the backlight unit 3, and the protrusion 13 is positioned so that it will pass through the cut-out 10 in the flexible substrate 4. In the present embodiment, the protrusion 13 and the cut-out 10 are formed at mutually corresponding positions and in mutually corresponding shapes. This prevents misalignment of the flexible substrates 4 from occurring during the assembly process, prevents cracks from occurring in the flexible substrates 4 due to stress, and prevents a malfunction such as a disconnection between the liquid crystal panel 2 and the circuit board 5 from occurring.

Subsequently, the circuit board 5 is fitted into the hook that is provided on the inner plate metal shield 9, and then the circuit board 5 is fixed thereon with a screw or the like. The external shield 7 is then placed on top of the liquid crystal panel 2 mounted on the backlight unit 3. The external shield 7 and the inner plate metal shield 9 are fitted together, whereby the backlight unit 3, the optical sheet 6, and the liquid crystal panel 2 are positioned and fixed together. The processes complete the LCD device 1 according to the present embodiment.

As described above, according to the LCD device 1 of the present embodiment, the flexible substrate 4 which connects together the liquid crystal panel 2 and the circuit board 5 has the cut-out 10 which is formed at a position on the side area of the LCD device 1. Furthermore, the protrusion 13 shaped so as to pass through the cut-out 10 is provided on the backlight unit 3 or the internal housing (the inner plate metal shield 9 or the inner resin chassis 8 and protrudes outward further than the flexible substrates 4. Therefore, even when applied in a high-precision LCD device, in which space is difficult to obtain between the flexible substrates 4, the protrusion 13 can prevent the external housing (the external shield 7) from deforming. Therefore, the flexible substrate 4 and the driver chip 11 mounted on the flexible substrate 4 can be protected with a higher degree of reliability, thereby providing a reliable LCD device.

FIG. 8 and FIG. 9 show a structure in which the flexible substrates 4 are aligned with equidistant spacing between them. In the present embodiment, the flexible substrates 4 are formed such that the protrusion 13 passes through the space formed by the cut-outs 10 in the flexible substrates 4. Therefore, the flexible substrates 4 do not have to be spaced at equal distances from each other. For example, there may be smaller spacings and larger spacings mixed in the LCD device. This provides a larger design choice as to the arrangement of the terminals in the liquid crystal panel 2, and also a larger design choice for the whole structure of the LCD device.

[Second Embodiment]

Figure 14:
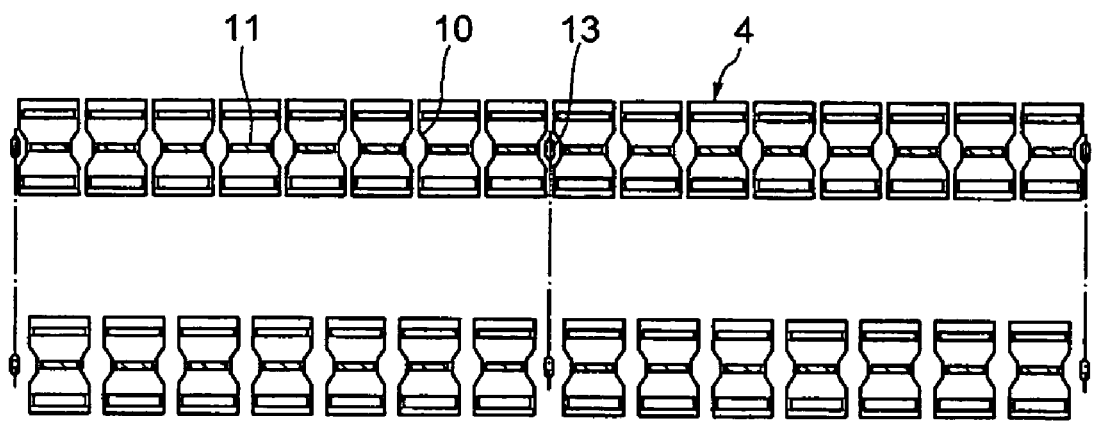
FIG. 14 is a top plan view showing positional relationships between the flexible substrates and the protrusions in an LCD device according to a second embodiment of the present invention.
Figure 15:
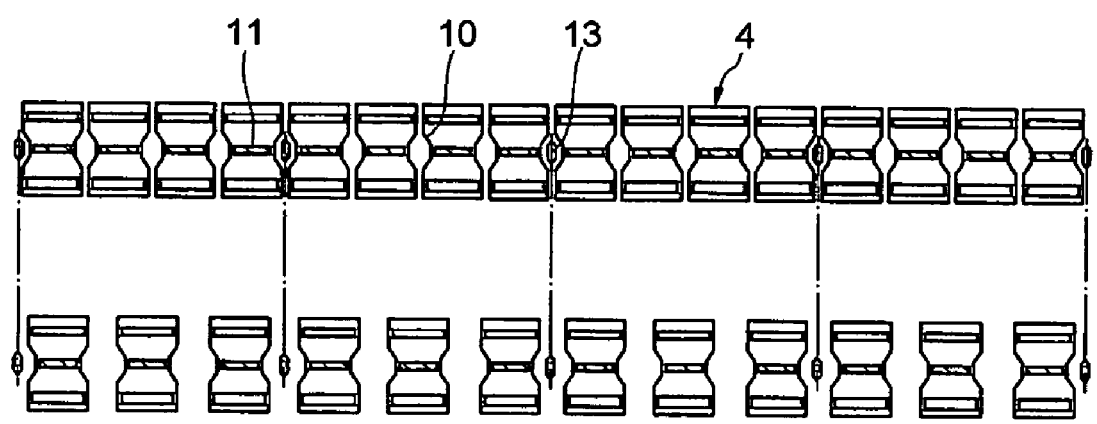
FIG. 15 is another top plan view showing positional relationships between the flexible substrates and the protrusions in the LCD device according to the second embodiment.
Figure 16:
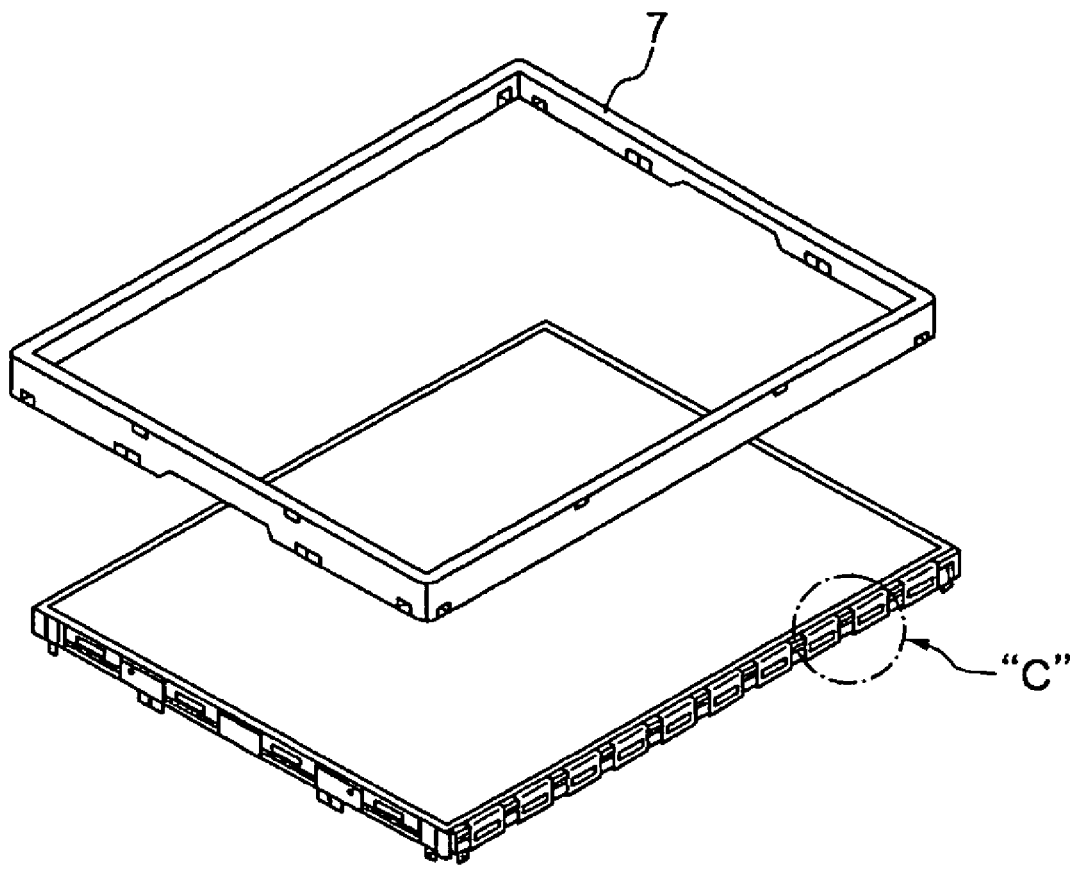
FIG. 16 is an exploded perspective view of a conventional LCD device, as viewed from its display screen side, including an additional detailed view "C".
Figure 16:
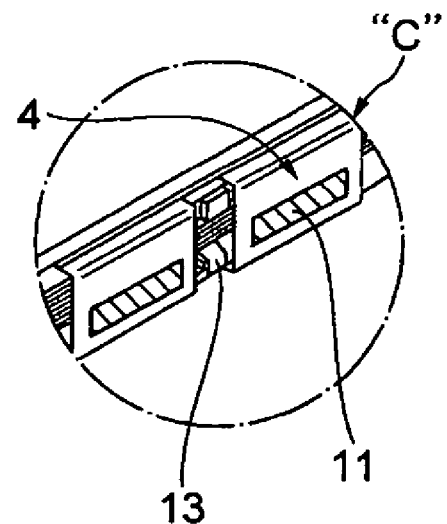
Figure 17:
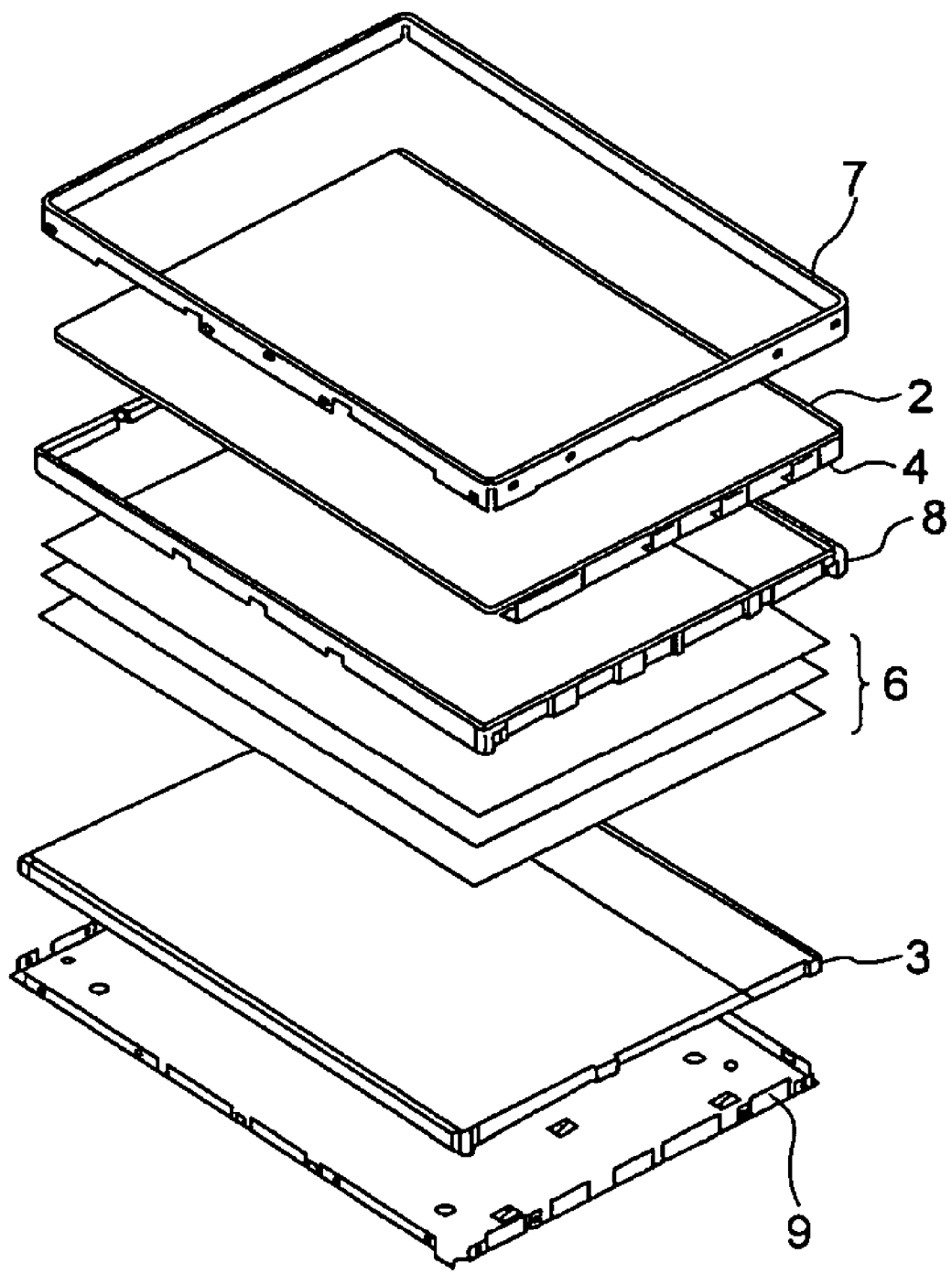
FIG. 17 is an exploded perspective view showing the components of the conventional LCD device.

With reference to FIG. 14 and FIG. 15, an LCD device according to a second embodiment of the present invention will be described. FIG. 14 and FIG. 15 are top plan views showing positional relationships between the flexible substrates and the protrusions, which are used in the LCD device according to the second embodiment. This embodiment enables the structure of the present invention to be applied in various types of LCD devices.

More specifically, in the first embodiment, the protrusion 13 was arranged at every position where the cut-outs 10 were formed in the flexible substrates 4 of a particular type of the LCD device (e.g., the QXGA type). However, if the protrusion 13 is provided to pass through every flexible substrate 4, the member formed with the protrusion 13 (e.g. the inner resin chassis 8, the inner plate metal shield 9, or the backlight unit 3) cannot be used in another type of the LCD device having a different number of flexible substrates 4, even when the size of the screen is the same. The protrusion 13 does not have to be provided for every flexible substrate 4 anyway. So long as the deformation of the external housing can be prevented, the protrusions 13 can be provided in a fewer number compared with the number of the flexible substrates 4.

The present embodiment is designed for LCD devices which are able to share components therebetween because they have almost the same screen size as each other, for example. Even when the protrusion 13 is formed on the inner resin chassis 8, the inner plate metal shield 9, the backlight unit 3 or the like, these components can also be shared by various types of LCD devices which require different quantities of flexible substrates 4. This is because of the position where the protrusion 13 is configured in the present example.

More specific descriptions will be now made with reference to the drawings. For example, the QXGA type LCD device having 2,048×3 data lines extending in the direction of the image lines (refer to FIG. 14(a)) must have 16 of the flexible substrates 4. Since the number of flexible substrates 4 is an even number, the cut-out 10 should be provided at least in the center. The cut-out 10 should be also provided in the center in another type of LCD device (refer to FIG. 14(b)) which also has an even number of the flexible substrates 4 (FIG. 4(b) exemplifies 14 substrates). Therefore, if the protrusion 13 is provided at three points (including both edges and the center area), then the components provided with the protrusions 13 can be used for any types of LCD device 1 which has an even number of flexible substrates 4.

Referring to FIG. 15, there is shown another case for the number of protrusions. The number of flexible substrates 4 provided in the QXGA type LCD device (refer to FIG. 15(a)) is an integral multiple of 4. Therefore, in this type, the cut-outs 10 should be provided on at least three of the four boundaries occurring along the direction of the image lines, i.e., the direction of the arrangement of the flexible substrates 4. In another type of LCD device (refer to FIG. 15(b)) which also has a flexible substrates 4 in number equal to an integral multiple of 4, the cut-outs 10 are also provided on the four boundaries. FIG. 15(b) exemplifies 12 substrates for the LCD device. Therefore, a total of five protrusions 13 are provided (i.e., both edges and three of the four boundaries) on the components. These components provided with such a number of protrusions 13 can be used for any types of LCD device so long as the LCD device has flexible substrates 4 in number equal to an integral multiple of 4.

The descriptions which are given above can be expressed as a general principle. When the number of flexible substrates 4 provided in a given LCD device 1 and the number of flexible substrates 4 provided in another LCD device 1 are both an integral multiple of n (where n is a positive number equal to or greater than 2 and may be selected in both the LCD devices independently of each other), the spaces formed by the cut-outs 10 are overlapped in both devices 1 at a number (n−1) of locations along the direction in which the boundaries between the flexible substrates occur, and at both ends, thereby amounting in a total of (n+1) locations. Therefore, if the protrusions 13 are provided only at these locations, then the components which are provided with the protrusions 13 can be shared in multiple types of LCD devices 1. Adopting this type of structure enables the components to be shared in a variety of types of the LCD devices, and thus the cost of the LCD devices can be reduced.

As described above, each protrusion 13 is located so as to pass through the center of opposing cut-outs 10 formed in two neighboring flexible substrates 4, and a plurality of protrusions 13 are arranged at equidistant intervals. In the present invention, there is a margin in the locations of the protrusions 13 due to the cut-outs 10 provided in the flexible substrates 4, and thus there is a larger design choice in the arrangement of the protrusions 13. Furthermore, the deformation of the external shield 7 can also be prevented even if the protrusions 13 are not placed at equidistant intervals. Therefore, when designing the LCD device 1, the overlapping spaces among the spaces formed by the cut-outs 10 in various types of LCD devices enable the protrusions 13 to be placed at only those overlapping spaces where the protrusion 13 can pass through. Thus, the components of many types of LCD devices can be shared.

Since the above embodiments are described only for examples, the present invention is not limited to the above embodiments and various modifications or alterations can be easily made therefrom by those skilled in the art without departing from the scope of the present invention.

What is claimed is:

1. A liquid crystal display (LCD) device comprising: a plurality of components including a liquid crystal panel having an array of terminals and a backlight unit disposed at rear side of said liquid crystal panel for irradiating said liquid crystal panel; an external housing for covering at least side surfaces of said components; a circuit board disposed at rear side of said backlight unit; at least one flexible substrate having a line pattern thereon for electrically connecting together said terminals and said circuit board, said flexible substrate having therein a cut-out on at least one of side edges of said flexible substrate; and a protrusion protruding from one of said components toward said external housing while passing said cut-out.

2. The LCD device according to claim 1, wherein said components further includes an internal housing member, and said protrusion protrudes from said internal housing member.

3. The LCD device according to claim 1, wherein said components further includes a shield member disposed between said backlight unit and said circuit board, and said protrusion protrudes from said shield member.

4. The LCD device according to claim 1, wherein said protrusion protrudes from said backlight unit.

5. The LCD device according to claim 1, wherein said flexible substrate mounts thereon a driver chip adjacent to said cut-out.

6. The LCD device according to claim 5, wherein said cut-out is of a trapezoid having a top side and a bottom side extending parallel to said one of side edges of said flexible substrate.

7. The LCD device according to claim 6, wherein said cut-out has a circular portion at a position corresponding to an apex of said trapezoid.

8. The LCD device according to claim 5, wherein said cut-out is of a semi-circle.

9. The LCD device according to claim 1, wherein said external housing has a depression corresponding to said protrusion.

10. The LCD device according to claim 1, wherein said at lest one flexible substrate include a plurality (n) of flexible substrates juxtaposed to one another, and said protrusion has a width larger than a gap between adjacent two of said flexible substrates except at the portion of said cut-out.

11. The LCD device according to claim 1, wherein said protrusion passes a boundary between adjacent said flexible substrates, and at least some of all the boundaries between said adjacent flexible substrates are passed by respective said protrusions.

12. The LCD device according to claim 11, wherein a pair of other protrusions passes outside an area where said plurality of flexible substrates are arranged.

13. The LCD device according to claim 11, wherein a total number of said protrusions and said other protrusions is equal to (n+1).

* * * * *